United States Patent [19]
Kim

[11] Patent Number: 5,940,451
[45] Date of Patent: Aug. 17, 1999

[54] AUTOMATIC GAIN CONTROL IN QUADRATURE PHASE SHIFT KEYING DEMODULATOR

[75] Inventor: Jong-Han Kim, Seoul, Rep. of Korea

[73] Assignee: Daewoo Electronics Co., Ltd., Seoul, Rep. of Korea

[21] Appl. No.: 08/916,202

[22] Filed: Aug. 22, 1997

[30] Foreign Application Priority Data

Aug. 23, 1996 [KR] Rep. of Korea ............... 96-35228

[51] Int. Cl.$^6$ ............................................. H04L 27/08
[52] U.S. Cl. ........................ 375/345; 375/331; 455/138; 455/139; 455/234.1
[58] Field of Search ............................ 375/329, 279, 375/280, 326, 345, 331; 455/138, 136, 139, 232.1, 234.1, 240.1, 245.1; 329/304; 330/129, 130, 254

[56] References Cited

U.S. PATENT DOCUMENTS

| | | | |
|---|---|---|---|
| 5,446,761 | 8/1995 | Nag et al. | 375/317 |
| 5,550,869 | 8/1996 | Guranzt et al. | 375/340 |
| 5,764,689 | 6/1998 | Walley | 375/345 |
| 5,828,692 | 10/1998 | Walley | 375/345 |

Primary Examiner—Tesfaldet Bocure
Assistant Examiner—Emmanuel Bayard
Attorney, Agent, or Firm—Pillsbury Madison & Sutro LLP

[57] ABSTRACT

An apparatus for automatic gain control (AGC) of a digital QPSK demodulator is disclosed. The apparatus for automatic gain control of a QPSK demodulator comprising a variable gain amplifier for controlling an amplification gain of a QPSK-demodulated signal by a predetermined gain control signal comprises a signal magnitude estimator for estimating the magnitude of I and Q-channel signals in the QPSK demodulator by using the equation $S_{mag}=\text{MAX}(|I|, |Q|)+\frac{1}{2}\text{MIN}(|I|,|Q|)$, and a control signal generator for generating a gain control signal according to the magnitude of the input signal outputted from the signal magnitude estimator, and outputting the gain control signal to a variable gain amplifier. Through the construction of the present invention, which generates the magnitude of signal used to generate the control signal for AGC by square root approximation, the ASIC without the complex circuit structure can be easily implemented in digital QPSK demodulators.

4 Claims, 4 Drawing Sheets

AUTOMATIC GAIN CONTROL IN QUADRATURE PHASE SHIFT KEYING DEMODULATOR

BACKGROUND OF THE INVENTION

1. Field of the Invention

The present invention relates to a Quadrature Phase Shift Keying (QPSK) demodulator, and more particularly to an apparatus for Automatic Gain Control (AGC) for obtaining the magnitude of an input signal in the QPSK demodulator by square-root approximation, and adjusting an amplitude gain of QPSK demodulation signal according to the obtained magnitude of the input signal to maintain the magnitude of QPSK demodulated signal within the analog-to-digital convertible range.

2. Description of the Prior Art

In digital communication system, digital receivers for receiving a digitally modulated information signal conventionally comprise a variable gain amplifier with a gain adjusted by a control signal. The process for adjusting the gain of a received signal using a control signal is called the Automatic Gain Control (AGC). In general, the digital receiver requires measurement of an output signal power of the variable gain amplifier, which is carried out by the AGC process. The measured value is compared with a value representing a desired signal power. A gain control signal for the variable gain amplifier is generated according to the compared result. The gain control signal is then used to control an amplifier gain so that the output signal power of the variable gain amplifier coincides with the desired signal power. To perform digital demodulation with an optimum signal to noise (S/N) ratio, AGC is used to hold the magnitude of a baseband signal to the full dynamic range of an analog to digital (A/D) converter.

A Phase Shift Keying (PSK) demodulation used in the digital communication system is a method for shifting a phase of carrier to a predetermined value on a signal space diagram according to the information signal. According to the number of phase in which the carrier has, the PSK demodulation is divided into a Binary Phase Shift Keying (BPSK) demodulation and a Quadrature Phase Shift Keying (QPSK) modulation. Between the two, QPSK is more widely used and FIG. 1 shows a QPSK bit mapping on a signal space diagram.

In FIG. 1, one symbol comprises an information signal, a 2-bits sequence and four symbols $S_1$, $S_2$, $S_3$, $S_4$ are positioned on each quadrant, and have a phase difference of $\pi/2$, respectively. When the signal is modulated, a bit signal corresponding to an in-phase channel (I-channel) is carried on a carrier $\cos\omega_0 t$ and a bit signal corresponding to an quadrature channel (Q-channel) is carried on a carrier $\sin\omega_0$, so that a superimposed signal between both signals is transmitted through the channel. In the receiver, the superimposed signal is inputted and the I-channel and Q-channel signals are divided by multiplying the inputted signal by a regenerated carrier of the $\cos\omega_0 t$ and $\sin\omega_0 t$ coincided with a frequency of the modulated carrier respectively. In comparison with the adjacent symbols having a different phase of $\pi/2$ radian, the QPSK modulated signal is mapped differently only by one-bit, and hence, a bit error rate generated by the phase is minimized when demodulating.

FIG. 2 shows a block diagram of a conventional QPSK demodulator. The QPSK demodulator comprises a carrier recovery unit 21, a matched filter 23, an automatic gain controller 25, and a symbol timing recovery unit 27.

In FIG. 2, in order to separate the I-channel signal I_in and the Q-channel signal Q_in, the carrier recovery unit 21 multiplies an I-channel signal I_in and a Q-channel signal Q_in of the baseband by the regenerated carrier of the $\cos\omega_0 t$ and $\sin\omega_0 t$ corresponding to the frequency of the modulated carrier respectively. Further, the carrier recovery unit 21 detects a phase error value for each of the separated I and Q-channel signals, and also for pulse-shaped I and Q-channel signals fed-back from the matched filer 23. It then outputs I and Q-channel signals with which the phase error is compensated to the matched filter 23.

The matched filter 23 pulse-shapes the I and Q-channel signals outputted from the carrier recovery unit 21, and outputs final demodulated I and Q-channel signals I_out and Q_out to the carrier recovery unit 21, the automatic gain controller 25, and to the symbol timing recovery unit 27.

The automatic gain controller 25 receives the final demodulated I and Q-channel signals I_out and Q_out, calculates the magnitude of signal inputted in the QPSK demodulator with respect to the I and Q-channel signal values, and generates a control signal AGC_out for adjusting a gain of an external or internal variable gain amplifier (not shown).

The symbol timing recovery unit 27 receives the final demodulated I and Q-channel signals I_out and Q_out, and generates an exact sampling clock from the detected timing error value for an analog/digital (A/D) converter (not shown).

Here, the calculated magnitude of input signal from the automatic gain controller 25 holds the level of the signal within input range of the A/D converter. Accordingly, the automatic gain controller 25 outputs the control signal AGC_out for increasing the gain if the magnitude of input signal in the QPSK demodulator is smaller than a predetermined reference value, whereas it outputs the control signal AGC_out for decreasing the gain if the magnitude of input signal in the QPSK demodulator is bigger than the predetermined reference value.

However, in the prior art, since the magnitude of signal for generating the control signal is calculated by a square-root formula, $\sqrt{(I^2+Q^2)}$, a complex circuit is required to extract the square root, posing a difficult structural problem for an ASIC used in the QPSK demodulator.

SUMMARY OF THE INVENTION

In view of the foregoing, it is an object of the present invention to provide an apparatus for automatic gain control, to calculate a magnitude of signal for generating a gain control signal to perform an AGC by using square-root approximation in a QPSK demodulator for an efficient utilization of ASIC by eliminating the need of its complex circuitry.

In order to achieve the above object, the present invention provides the apparatus for automatic gain control in a QPSK demodulator for demodulating a QPSK-modulated information signal according to a phase of a transmitted carrier, the apparatus comprising:

a signal magnitude estimator for estimating the magnitude of the I and Q-channel signals inputted in the QPSK demodulator by using the equation $S_{mag}=\text{MAX}(|I|,|Q|)+\frac{1}{2}\text{MIN}(|I|,|Q|)$ where $|I|$ and $|Q|$ represent absolute values of I and Q-channel signals, respectively, $S_{mag}$ represents the magnitude of the input signal, and MAX(a,b) and MIN(a,b) represent operators for selecting larger and smaller value between a and b, respectively; and a control signal generator for generating a gain control signal according to the magnitude of the signal outputted from the signal magnitude estimator, and outputting the gain control signal to the variable gain amplifier.

BRIEF DESCRIPTION OF THE DRAWINGS

The above and other objects features, and advantages of the present invention will be apparent from the following detailed description of the preferred embodiments of the invention in conjunction with the accompanying drawings, in which.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 1:
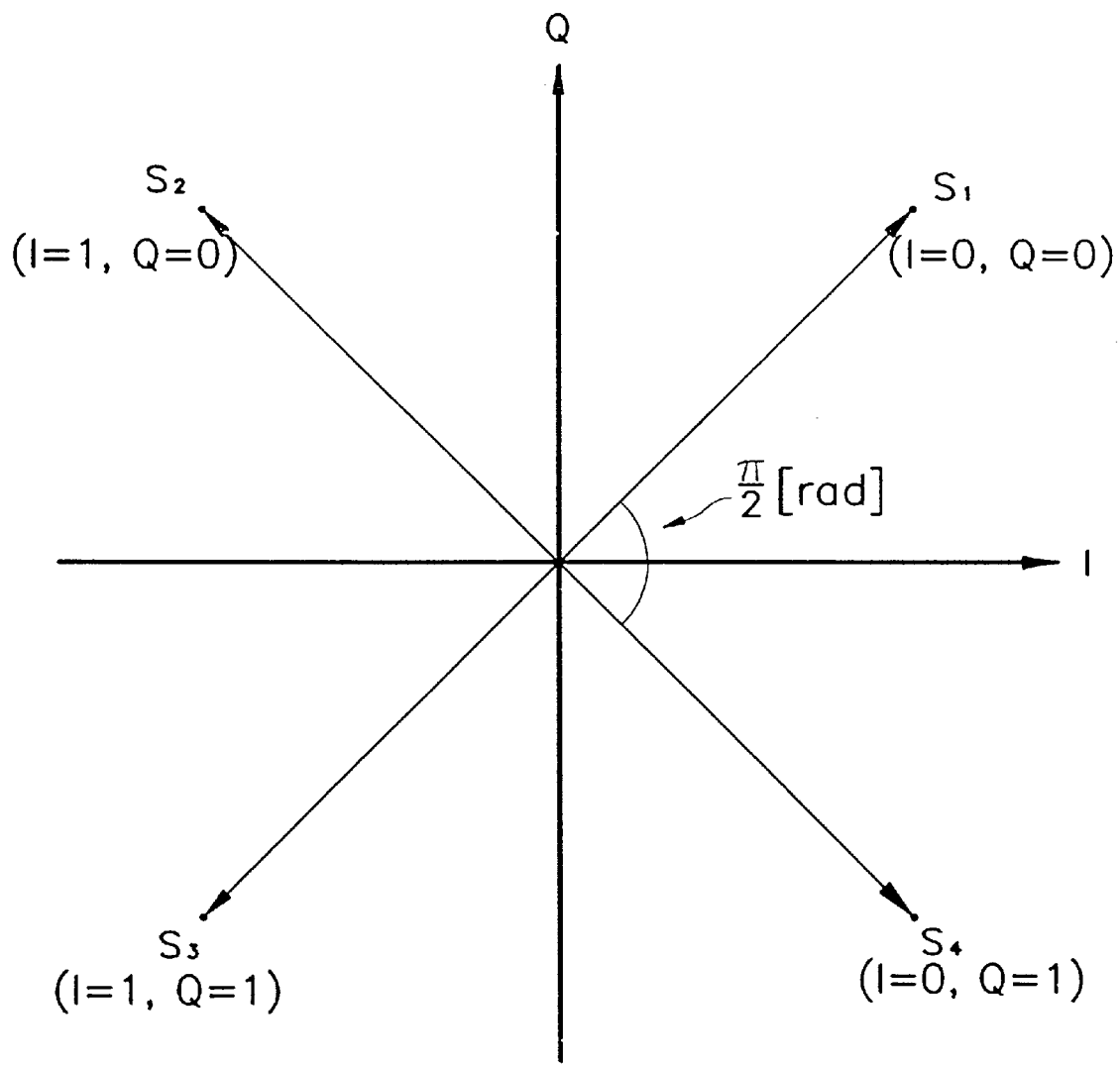
FIG. 1 is a view illustrating four QPSK demodulation signals on a signal space diagram.
Figure 2:
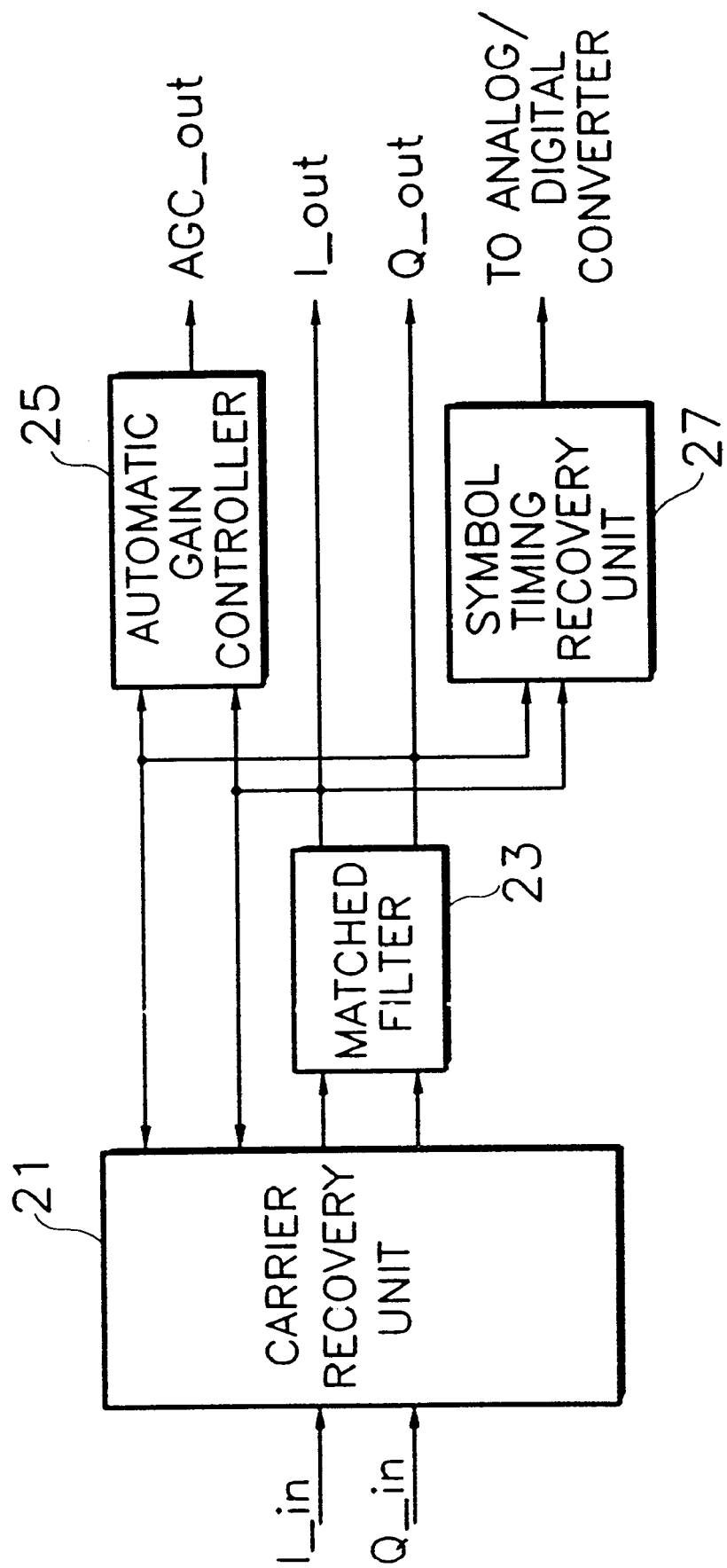
FIG. 2 is a block diagram illustrating a conventional QPSK demodulator.
Figure 3:
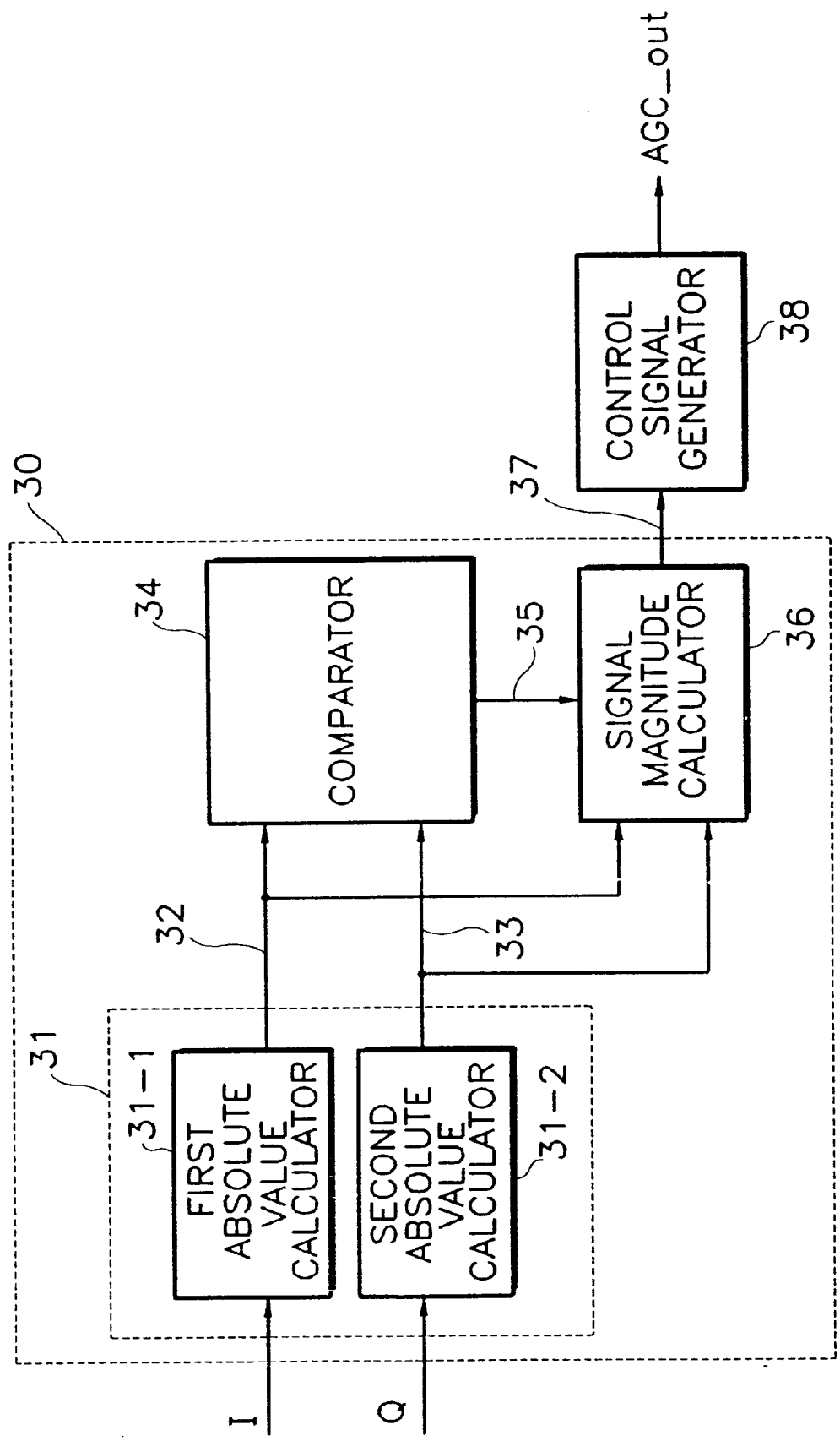
FIG. 3 is a block diagram illustrating an apparatus for automatic gain control of the present invention in the QPSK demodulator.

An apparatus for automatic gain control of the present invention illustrated in FIG. 3 largely comprises by a signal magnitude estimator 30 for estimating a magnitude of signal inputted in a QPSK demodulator and a control signal generator 38. The signal magnitude estimator 30 comprises an absolute value calculator 31 having a first absolute value calculator 31-1 and a second absolute calculator 31-2, a comparator 34 for comparing both absolute values and a signal magnitude calculator 36 for calculating the magnitude of signal from both absolute values according to a result of the comparison.

Referring to an operation of the apparatus for automatic gain control illustrated in FIG. 3, the first and second absolute calculators 31-1 and 31-2 receive I and Q-channel signals and calculate their absolute values, respectively.

The comparator 34 receives absolute values 32 and 33 of I and Q-channel signals from the absolute value calculator 31, compares both absolute values, and outputs a signal 35 according to a result of the comparison.

The signal magnitude calculator 36 receives absolute values 32 and 33 of I and Q-channel signals from the absolute value calculator 31, adds a larger absolute value with ½ of a smaller absolute value according to a comparison result signal 35 from the comparator 34, and outputs the sum as a magnitude of the signal.

Here, an approximation used to calculate the magnitude of signal $S_{mag}$ in the present invention is derived from the following expressions 1 and 2.

$$S_{mag} = \sqrt{(I^2 + Q^2)} = |I|\sqrt{\left(1 + \left(\frac{Q}{I}\right)^2\right)} \quad \text{Expression 1}$$

$$\approx |I|\left(1 + \frac{1}{2}\sqrt{\left(\frac{Q}{I}\right)^2}\right) \approx |I|\left(1 + \frac{1}{2}\frac{|Q|}{|I|}\right)$$

$$= |I| + \frac{1}{2}|Q|.$$

$$S_{mag} = \sqrt{(I^2 + Q^2)} = |Q|\sqrt{\left(1 + \left(\frac{I}{Q}\right)^2\right)} \quad \text{Expression 2}$$

$$\approx |Q|\left(\frac{1}{2}\sqrt{\left(\frac{I}{Q}\right)^2} + 1\right) \approx |Q|\left(\frac{1}{2}\frac{|I|}{|Q|} + 1\right)$$

$$= |Q| + \frac{1}{2}|I|.$$

In the above expressions 1 and 2, $|I|$ and $|Q|$ represent absolute values of I and Q-channel signals, respectively. The expression 1 is satisfied only if $|I|$ is larger than $|Q|$, and inversely, the expression 2 is satisfied only if $|Q|$ is larger than $|I|$.

Alternatively, the signal magnitude $S_{mag}$ can be obtained by the following expression 3, which is a combined equivalent of the above two expressions.

$$S_{mag} = MAX(|I|, |Q|) + \frac{1}{2}MIN(|I|, |Q|) \quad \text{Expression 3.}$$

Here, MAX(a, b) and MIN(a, b) represent operators for selecting larger and smaller values between a and b, respectively.

In brief, the magnitude of signal is obtained after comparing absolute values of I and Q-channel signals and adding the larger absolute value with ½ of the smaller absolute value.

The control signal generator 38 generates a gain control signal according to the magnitude of signal 37 obtained from the signal magnitude calculator 36, and provides it to an internal or external variable gain amplifier (not shown).

Figure 4:
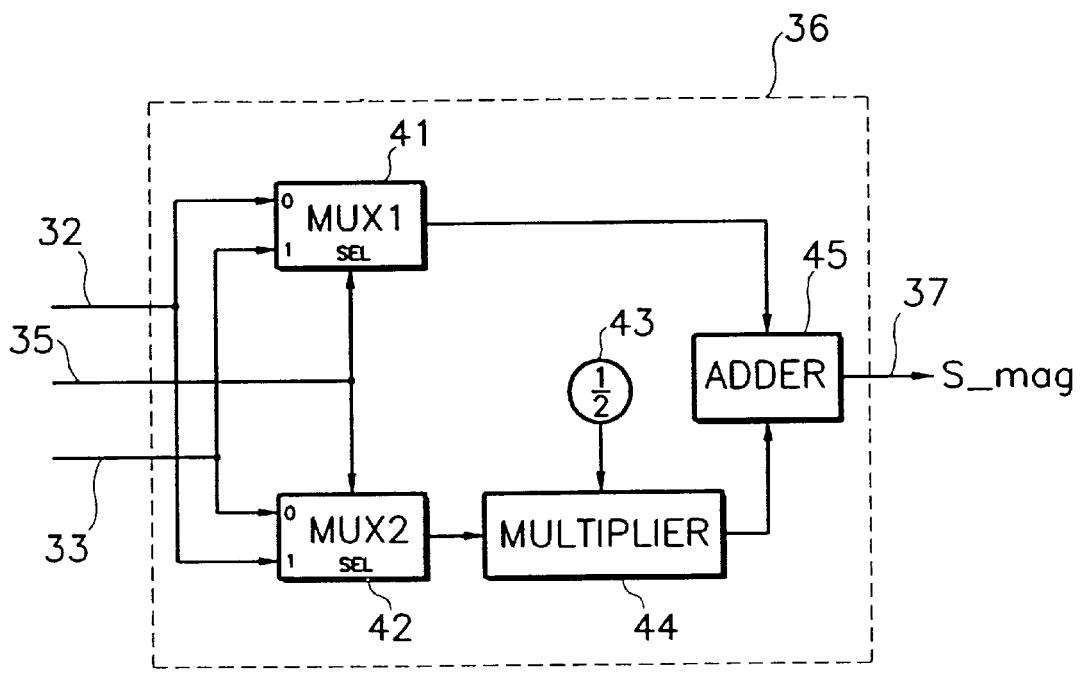
FIG. 4 is a block diagram of a signal magnitude calculator illustrated in FIG. 3 in accordance with a first embodiment of the present invention.

FIG. 4 shows a block diagram of the signal magnitude calculator 36 illustrated in FIG. 3 in accordance with a first embodiment of the present invention. The signal magnitude calculator 36 comprises a first multiplexer 41, a second multiplexer 42, an adder 45, a memory 43 for storing ½" value such as a ROM or a latch, and a mutiplier 44.

The first multiplexer 41 selects and outputs the larger value of the absolute values 32 and 33 of I and Q-channel signals inputted in first and second input terminals 0 and 1, respectively, according to the comparison result signal 35 from the comparator 34. Namely, when the comparison result signal 35 represents the absolute value 32 of I-channel signal larger than the absolute value 33 of Q-channel signal, the first multiplexer 41 selects and outputs the absolute value 32 of I-channel signal. On the contrary, when the comparison result signal 35 represents the absolute value 32 of I-channel signal smaller than the absolute value 33 of Q-channel signal, the first multiplexer 41 selects and outputs the absolute value 33 of Q-channel signal.

The second multiplexer 42 selects and outputs a smaller value of the absolute values 33 and 32 of Q and I-channel signals inputted in first and second input terminals 0 and 1, respectively, according to the comparison result signal 35 of the comparator 34. Namely, when the comparison result signal 35 represents the absolute value 32 of I-channel signal larger than the absolute value 33 of Q-channel signal, the second multiplexer 42 selects and outputs the absolute value 33 of Q-channel signal. On the contrary, when the comparison result signal 35 represents the absolute value 32 of I-channel signal smaller than the absolute value 33 of Q-channel signal, the second multiplexer 42 selects and outputs the absolute value 32 of I-channel signal.

Namely, the absolute value 32 of I-channel signal is applied to the first input terminal 0 of the first mutiplexer 41 and the second input terminal 1 of the second mutiplexer 42, and the absolute value 33 of Q-channel signal is applied to the second input terminal 1 of the first mutiplexer 41 and the first input terminal 0 of the second mutiplexer 42, so that the first and second multiplexers 41 and 42 select and output the signal of the same input terminal according to the comparison result signal 35.

The multiplier 44 multiplies the smaller absolute value from the second multiplexer 42 by "½" value stored in the memory 43, and outputs the result.

The adder 45 adds the larger absolute value outputted from the first multiplexer 41 to the value obtained from the multiplier 44, and outputs this result as the magnitude of signal 37. Namely, the output from the adder 45 is |I|+½|Q| when the absolute value 32 of I-channel signal is larger than the absolute value 33 of Q-channel signal, whereas |Q|+½|I| when the absolute value 32 of I-channel signal is smaller than the absolute value 33 of Q-channel signal.

Figure 5:
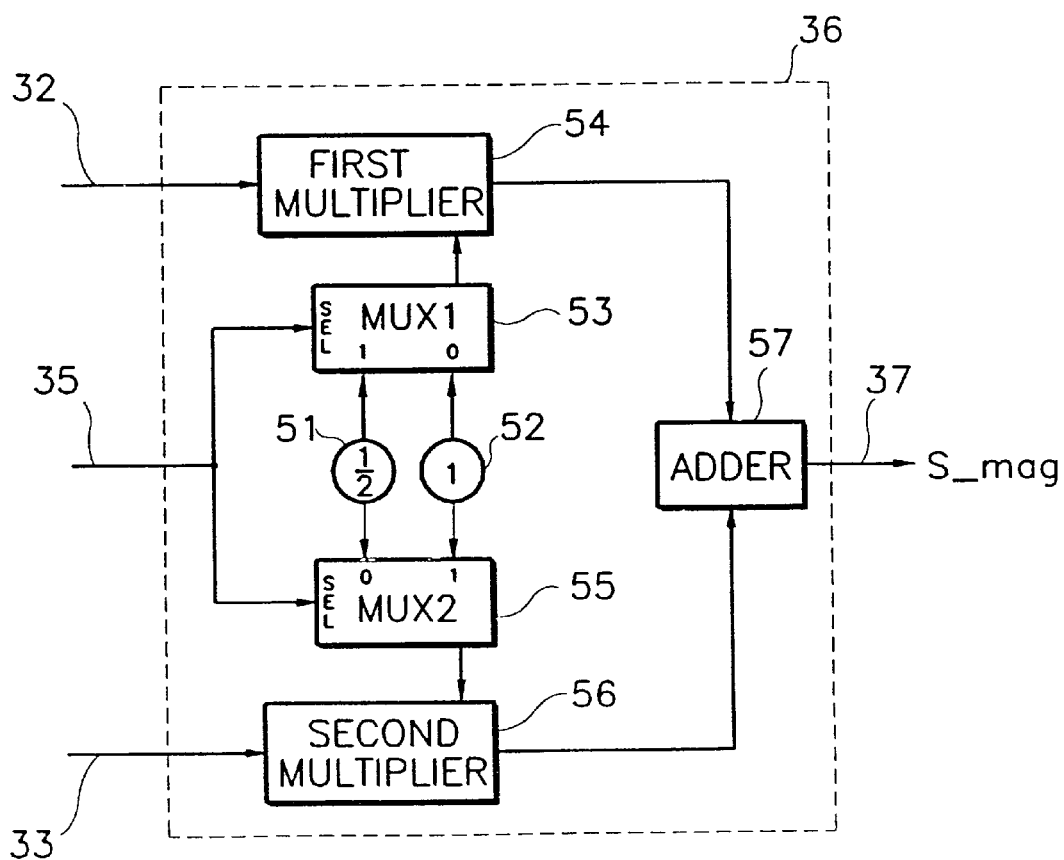
FIG. 5 is a block diagram of a signal magnitude calculator illustrated in FIG. 3 in accordance with a second embodiment of the present invention.

FIG. 5 shows a block diagram of the signal magnitude calculator 36 illustrated in FIG. 3 in accordance with a second embodiment of the present invention. The signal magnitude calculator 36 comprises a first memory 51 for storing "½" value such as a ROM or a latch, a second memory 52 for storing "1" value such as a ROM or a latch, a first multiplexer 53, a first multiplier 54, a second multiplexer 55, a second multiplier 56, and an adder 57.

Now, an operation of the signal magnitude calculator 36 will be described in detail in connection with FIG. 3.

The first multiplexer 53 outputs selectively any one of "1" value from the second memory 52 inputted in the first input terminal 0 and "½" value from the first memory 51 inputted in the second input terminal 1, according to a comparison result signal 35 from the comparator 34, applied to a selection terminal SEL. Namely, when the comparison result signal 35 represents the absolute value 32 of I-channel signal larger than the absolute value 33 of Q-channel signal, the first multiplexer 53 outputs "1" value. On the contrary, when the comparison result signal 35 represents the absolute value 32 of I-channel signal smaller than the absolute value 33 of Q-channel signal, the first multiplexer 53 outputs "½" value.

The second multiplexer 55 outputs selectively any one of "½" value from the first memory 51 inputted in the first input terminal 0 and "1" value from the second memory 52 inputted in the second input terminal 1, according to a comparison result signal 35 of the comparator 34 applied to the selection terminal SEL. Namely, when the comparison result signal 35 represents the absolute value 32 of I channel signal larger than the absolute value 33 of Q-channel signal, the second multiplexer 55 outputs "½" value. On the contrary, when the comparison result signal 35 represents the absolute value 32 of I-channel signal smaller than the absolute value 33 of Q-channel signal, the second multiplexer 55 outputs "1" value.

Namely, the "½" value from the first memory 51 is input to the second input terminal 1 of the first multiplexer 53 and the first input terminal 0 of the second multiplexer 55, and the "1" value from the second memory 52 is input to the first input terminal 0 of the first multiplexer 53 and the second input terminal 1 of the second multiplexer 55. Accordingly, the first and second multiplexers 53 and 55 output selectively the signal of the same input terminal according to the comparison result signal 35.

The first multiplier 54 multiplies the absolute value 32 of I-channel signal by a constant value outputted from the first multiplexer 53, and outputs the result. Namely, the output from the first multiplier 54 is |I| when the absolute value 32 of I-channel signal is larger than the absolute value 33 of Q-channel signal, whereas ½|I| when the absolute value 32 of I-channel signal is smaller than the absolute value 33 of Q-channel signal.

The second multiplier 56 multiplies the absolute value 33 of Q-channel signal by a constant value outputted from the second multiplexer 55, and outputs the result. Namely, the output from the second multiplier 56 is ½|Q| when the absolute value 32 of I-channel signal is larger than the absolute value 33 of Q-channel signal, whereas |Q| when the absolute value 32 of I-channel signal is smaller than the absolute value 33 of Q-channel signal.

The adder 57 adds the output from the first multiplier 54 to the output from the second multiplier 56, and outputs the result as a magnitude of signal 37. Namely, the output from the adder 57 is |I|+½|Q| when the absolute value 32 of I-channel signal is larger than the absolute value 33 of Q-channel signal, whereas |Q|+½|I| when the absolute value 32 of I-channel signal is smaller than the absolute value 33 of Q-channel signal.

As described above, in accordance with the apparatus and method for automatic gain control of the present invention, a hardware for using the square root approximation instead of a square root can be implemented when calculating the magnitude of input signal of QPSK demodulator for generating the gain control signal to perform AGC. Accordingly, the circuit structure of ASIC of the QPSK demodulator becomes simple for its effective utilization, and a time for calculating the magnitude of signal can be decreased.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. An apparatus for automatic gain control of a QPSK demodulator comprising a variable gain amplifier for controlling amplification gain of a QPSK-demodulated signal responsive to a gain control signal, comprising:

a signal magnitude estimator for estimating the magnitude of I and Q-channel signals in the QPSK demodulator and providing an estimated magnitude signal indicative thereof; and a control signal generator for generating the gain control signal according to the estimated magnitude signal, and providing the gain control signal to the variable gain amplifier, wherein said signal magnitude estimator comprises:

an absolute value calculator for calculating absolute values of the I and Q-channel signals, respectively;

a comparator for comparing both absolute values of the I and Q-channel signals; and a signal magnitude calculator for calculating the magnitude of an input signal by adding a larger absolute value to ½ of a smaller absolute value according to a result of said comparator, said signal magnitude calculator comprising:

a first multiplexer for selecting and outputting a larger value of absolute values of I and Q-channel signals according to the result of said comparator;

a second multiplexer for selecting and outputting a smaller value of absolute values of I and Q-channel signals according to the result of said comparator;

a multiplier for multiplying the smaller absolute value inputted from said second multiplexer by "½" value and outputting the result; and an adder for adding the larger value outputted from said first multiplexer to ½ of the smaller value outputted from said multiplier and outputting the result as a magnitude of the input signal.

2. The apparatus for automatic gain control of claim 1, wherein said signal magnitude calculator further comprises a memory for storing the "½" value.

3. An apparatus for automatic gain control of a QPSK demodulator comprising a variable gain amplifier for controlling amplification gain of a QPSK-demodulated signal responsive to a gain control signal, comprising:

a signal magnitude estimator for estimating the magnitude of I and Q-channel signals in the QPSK demodulator and providing an estimated magnitude signal indicative thereof; and a control signal generator for generating the gain control signal according to the estimated magnitude signal, and providing the gain control signal to the variable gain amplifier, wherein said signal magnitude estimator comprises:

an absolute value calculator for calculating absolute values of the I and Q-channel signals, respectively;

a comparator for comparing both absolute values of the I and Q-channel signals; and a signal magnitude calculator for calculating the magnitude of an input signal by adding a larger absolute value to ½ of a smaller absolute value according to a result of said comparator, said signal magnitude calculator comprising:

a first multiplexer for selectively outputting "½" or "1" value according to the comparison result of said comparator;

a first multiplier for receiving values outputted from said first multiplexer and an absolute value of the I-channel signal, and multiplying the both values;

a second multiplexer for outputting alternately "½" or "1" value to said first multiplexer according to the comparison result of said comparator;

a second multiplier for receiving a value outputted from said second multiplexer and an absolute value of the Q-channel signal, and multiplying the both values; and an adder for receiving outputs from said first and second multipliers, adding both output values, and outputting the sum as a magnitude of the input signal.

4. The apparatus for automatic gain control of claim 3, wherein said signal magnitude calculator further comprises a first memory for storing the "½" value and a second memory for storing the "1" value.

* * * * *